(12) United States Patent
Chang

(10) Patent No.: US 10,592,448 B2
(45) Date of Patent: Mar. 17, 2020

(54) MASTER-SLAVE SYSTEM, COMMAND EXECUTION METHOD AND DATA ACCESS METHOD WITH USE OF SERIAL PERIPHERAL INTERFACE (SPI)

(71) Applicant: Guangzhou Tyrafos Semiconductor Technologies Co., LTD, Guangzhou (CN)

(72) Inventor: Keng-Li Chang, Taipei (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 0 days.

(21) Appl. No.: 16/252,716

(22) Filed: Jan. 21, 2019

(65) Prior Publication Data
US 2020/0034319 A1    Jan. 30, 2020

(30) Foreign Application Priority Data
Jul. 27, 2018   (TW) .............................. 107126012 A

(51) Int. Cl.
*G06F 13/20* (2006.01)
*G06F 13/42* (2006.01)

(52) U.S. Cl.
CPC .......... *G06F 13/20* (2013.01); *G06F 13/4282* (2013.01); *G06F 2213/0002* (2013.01)

(58) Field of Classification Search
CPC combination set(s) only.
See application file for complete search history.

(56) References Cited

U.S. PATENT DOCUMENTS

| | | | |
|---|---|---|---|
| 7,849,229 B2 | 12/2010 | Escamilla | |
| 8,364,873 B2* | 1/2013 | Chen | G06F 13/387 710/10 |
| 2009/0103364 A1* | 4/2009 | Pekny | G06F 12/0246 365/185.17 |
| 2010/0138576 A1* | 6/2010 | Goerlich | G06F 13/4291 710/110 |
| 2010/0199007 A1 | 8/2010 | Kapelner | |

(Continued)

FOREIGN PATENT DOCUMENTS

| | | |
|---|---|---|
| CN | 104714908 | 6/2015 |
| TW | 200849025 | 12/2008 |

(Continued)

OTHER PUBLICATIONS

"Office Action of Taiwan Counterpart Application," dated Jun. 28, 2019, p. 1-p. 23.

*Primary Examiner* — Raymond N Phan
(74) *Attorney, Agent, or Firm* — JCIPRNET

(57) ABSTRACT

A master-slave system, a command execution method, and a data access method are provided. The master-slave system includes a master device and a slave device. The master device provides a first command and a clock signal to the slave device. The slave device executes a first operation corresponding to the first command according to the first command and the clock signal. When the first operation corresponding to the first command is completed, the slave device generates a response signal according to the clock signal to notify the master device an execution result of the first operation corresponding to the first command.

28 Claims, 7 Drawing Sheets

(56) References Cited

U.S. PATENT DOCUMENTS

| | | | | |
|---|---|---|---|---|
| 2011/0072297 A1* | 3/2011 | Huang | ................ | G06F 13/4282 |
| | | | | 713/500 |
| 2011/0078350 A1* | 3/2011 | Carls | ........................ | G06F 1/04 |
| | | | | 710/110 |
| 2011/0106979 A1 | 5/2011 | Yoo et al. | | |
| 2012/0072628 A1* | 3/2012 | Crockett | ............. | G06F 13/4291 |
| | | | | 710/110 |
| 2013/0297829 A1* | 11/2013 | Berenbaum | ......... | G06F 13/4256 |
| | | | | 710/3 |
| 2014/0052881 A1* | 2/2014 | Alley | ................. | G06F 13/4291 |
| | | | | 710/110 |

FOREIGN PATENT DOCUMENTS

| | | |
|---|---|---|
| TW | 201128348 | 8/2011 |
| TW | 201418992 | 5/2014 |
| TW | 201712555 | 4/2017 |

* cited by examiner

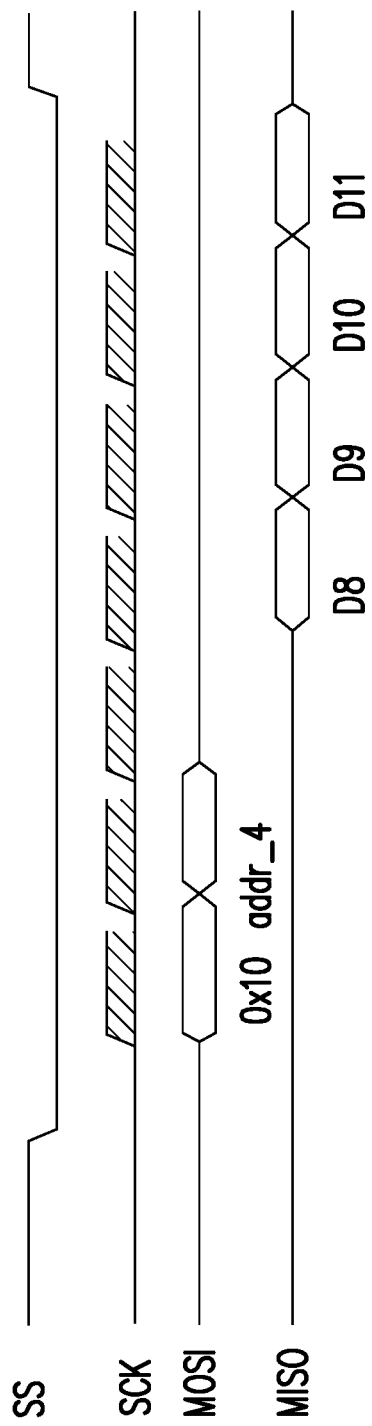
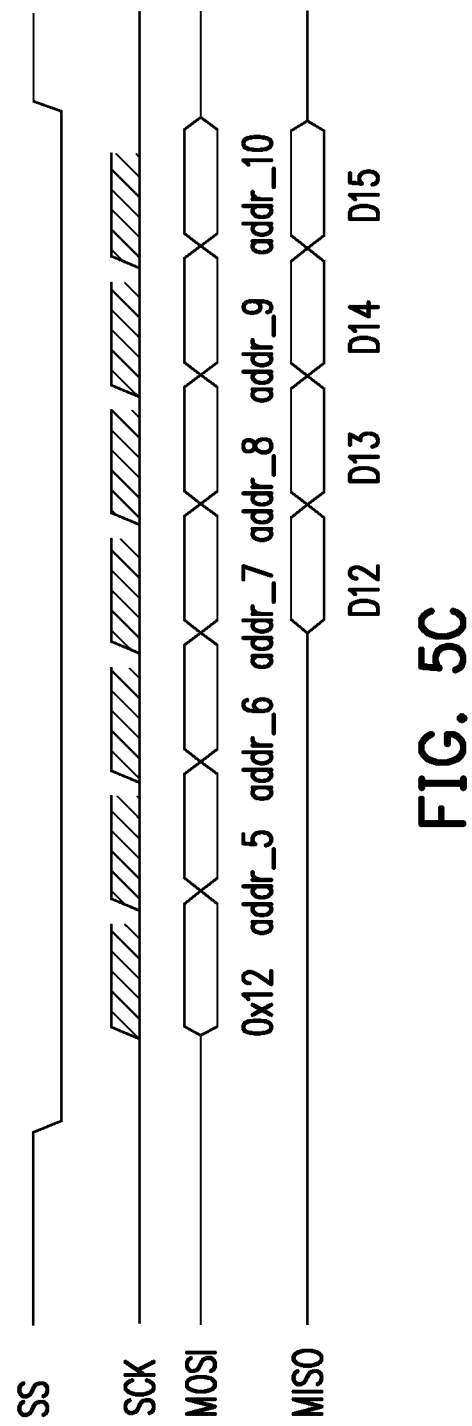

MASTER-SLAVE SYSTEM, COMMAND EXECUTION METHOD AND DATA ACCESS METHOD WITH USE OF SERIAL PERIPHERAL INTERFACE (SPI)

CROSS-REFERENCE TO RELATED APPLICATION

This application claims the priority benefit of Taiwan application serial no. 107126012, filed on Jul. 27, 2018. The entirety of the above-mentioned patent application is hereby incorporated by reference herein and made a part of this specification.

BACKGROUND OF THE INVENTION

1. Field of the Invention

The invention relates to a master-slave system, a command execution method and a data access method, and more particularly, relates to a master-slave system, a command execution method and a data access method with use of a serial peripheral interface (SPI).

2. Description of Related Art

In traditional image sensors, an Inter-Integrated Circuit (I2C) interface is often used as a bridge between the system and the sensor, and a parallel interface is used to transmit data. However, the I²C interface is slow, and the parallel interface has a large number of pins. In general, the serial peripheral interface (SPI) being used instead of the two interfaces above can solve the disadvantages of slow speed and excessive number of pins in specific applications. The characteristics of the SPI interface may be utilized to create a design that is more efficient or able to save more chip area for certain digital circuits inside the image sensor.

SUMMARY OF THE INVENTION

The invention provides a master-slave system, a command execution method, and a data access method. The master-slave system of the invention can allow the slave device to execute the corresponding operation directly according to the clock signal transmitted from the master device, so as to omit (or reduce) circuits for generating the clock signal in the slave device and definition for the operation code.

The invention proposes a master-slave system. The master-slave system includes a master device having a first interface and a slave device having a second interface. The second interface is electrically connected to the first interface. The master device provides a first command and a clock signal to the slave device. The slave device executes a first operation corresponding to the first command according to the first command and the clock signal. When the first operation corresponding to the first command is completed, the slave device generates a response signal according to the clock signal to notify the master device an execution result of the first operation corresponding to the first command.

The invention proposes a command execution method for a master-slave system. The master-slave system includes a master device having a first interface and a slave device having a second interface. The second interface is electrically connected to the first interface. The method includes: providing a first command and a clock signal to the slave device by the master device; executing a first operation corresponding to the first command by the slave device according to the first command and the clock signal; and when the first operation corresponding to the first command is completed, generating a response signal by the slave device according to the clock signal to notify the master device an execution result of the first operation corresponding to the first command.

The invention proposes a master-slave system. The master-slave system includes a master device having a first interface and a slave device having a second interface. The second interface is electrically connected to the first interface. The master device provides a first operation code (OP code), a first address and a clock signal to the slave device. The slave device executes a first access operation to access first data corresponding to the first address according to the first operation code, the first address and the clock signal. When the slave device finishes accessing the first data corresponding to the first address and the slave device does not receive the clock signal again before the master finishes operations corresponding to the first operation code, the slave device finishes executing the first access operation. When the slave device finishes accessing the first data corresponding to the first address and the slave device continuously receives the clock signal, the slave device accesses second data corresponding to a second address according to the clock signal, wherein the second address is adjacent to the first address.

The invention proposes a data access method for a master-slave system. The master-slave system includes a master device having a first interface and a slave device having a second interface. The second interface is electrically connected to the first interface. The method includes: providing a first operation code (OP code), a first address and a clock signal to the slave device by the master device; executing a first access operation by the slave device to access first data corresponding to the first address according to the first operation code, the first address and the clock signal; when the slave device finishes accessing the first data corresponding to the first address and the slave device does not receive the clock signal again before the master finishes operations corresponding to the first operation code, finishing executing the first access operation by the slave device; and when the slave device finishes accessing the first data corresponding to the first address and the slave device continuously receives the clock signal, accessing second data corresponding to a second address by the slave device according to the clock signal, wherein the second address is adjacent to the first address.

Based on the above, the master-slave system, the command execution method and the data access method of the invention can allow the slave device to execute the corresponding operation directly according to the clock signal transmitted from the master device, so as to omit (or reduce) the circuits for generating the clock signal in the slave device. Moreover, in the master-slave system, the command execution method and the data access method of the invention, the same operation code (OP code) used in the single-shot-mode transmission may also be used when multiple data for continuous address are to be transmitted using the burst-mode data transmission between the master device and the slave device. Accordingly, since the same operation code may be used to support the single-shot-mode data transmission and the burst-mode data transmission, definition for the OP codes may be simplified and the number of states in a finite state-machine may be reduced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A to FIG. 5C are schematic diagrams illustrating data reading according to an embodiment of the invention.

DESCRIPTION OF THE EMBODIMENTS

Figure 1:
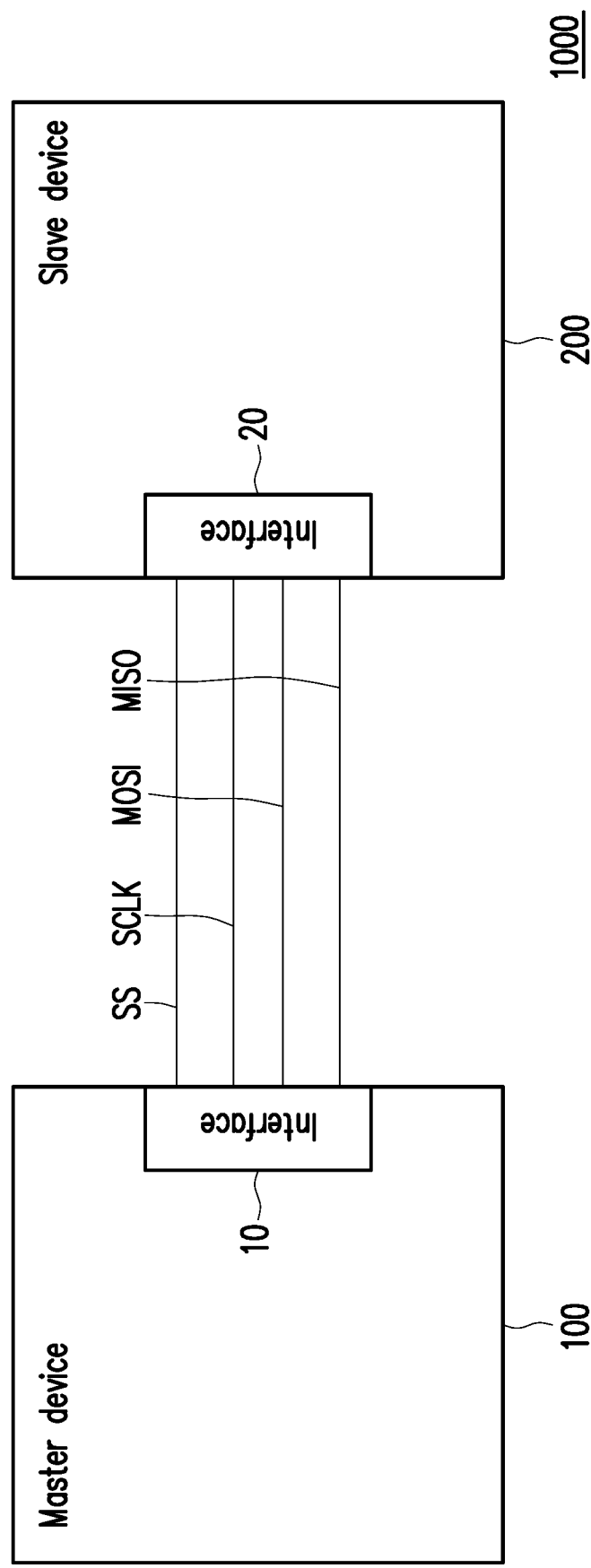
FIG. 1 is a schematic diagram illustrating a master-slave system according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Descriptions of the invention are given with reference to the exemplary embodiments illustrated with accompanied drawings, in which same or similar parts are denoted with same reference numerals. In addition, whenever possible, identical or similar reference numbers stand for identical or similar elements in the figures and the embodiments.

FIG. 1 is a schematic diagram illustrating a master-slave system according to an embodiment of the invention.

With reference to FIG. 1, a master-slave system 1000 includes a master device 100 and a slave device 200. Each of the master device 100 and the slave device 200 may include, for example, a processing unit (not illustrated) or a storage unit (not illustrated). In the master device 100 and the slave device 200, the storage unit may be coupled to the processing unit. Here, the master device 100 and the slave device 200 may be, for example, electronic devices such as cell phones, tablet computers, notebook computers or the like, but not limited thereto. Further, in other embodiments, the master device 100 and the slave device 200 may also include more of other devices. In particular, in other embodiments, the master device 100 and the slave device 200 may also be disposed in the same device. It should be noted that, although FIG. 1 only shows that one main device 100 is connected to one slave device 200, the invention is not limited thereto. In other embodiments, one master device 100 may be connected multiple slave devices 200.

The processing unit may be a central processing unit (CPU) or other programmable devices for general purpose or special purpose such as a microprocessor and a digital signal processor (DSP), a programmable controller, an application specific integrated circuit (ASIC) or other similar devices or a combination of above-mentioned devices.

The storage unit may be a fixed or a movable device in any possible forms including a random access memory (RAM), a read-only memory (ROM), a flash memory or other similar devices, or a combination of the above-mentioned devices.

In particular, in this exemplary embodiment, the master device 100 has an interface 10 (a.k.a. a first interface), and the slave device 200 has an interface 20 (a.k.a. a second interface). Among them, the first interface and the second interface are electrically connected (or, coupled) to each other so the master device 100 can conduct a data transmission with the slave device 200. In this exemplary embodiment, the interface 10 and the interface 20 are serial peripheral Interfaces (SPI). Here, one serial peripheral interface has a select slave (SS) pin, a serial clock (SCLK) pin, a master output slave input (MOSI) pin and a master input slave output (MISO) pin. When the interface 10 is electrically connected to the interface 20, the SS pin of the master device 100 is electrically connected to the SS pin of the slave device 200; the SCLK pin of the master device 100 is electrically connected to the SCLK pin of the slave device 200; the MOSI pin of the master device 100 is electrically connected to the MOSI pin of the slave device 200; and the MISO pin of the master device 100 is electrically connected to the MISO pin of the slave device 200.

In this exemplary embodiment, the storage unit of the master device 100 is stored with a plurality of program code segments. After being installed, the program code segments are executed by the processing unit of the master device 100. For example, the storage unit of the master device 100 includes a plurality of modules, and operations of the master-slave system 1000 are respectively executed by these modules. Here, each of the modules is composed of one or more program code segments. However, the invention is not limited in this regard. Each of the operations may also be implemented in other hardware manners. In addition, the processing unit of the master device 100 may also be used to conduct the data transmission between the master device 100 and the slave device 200.

The manner in which the master device 100 and the slave device 200 operate with each other will be described below with reference to various embodiments.

First Embodiment

Figure 2:
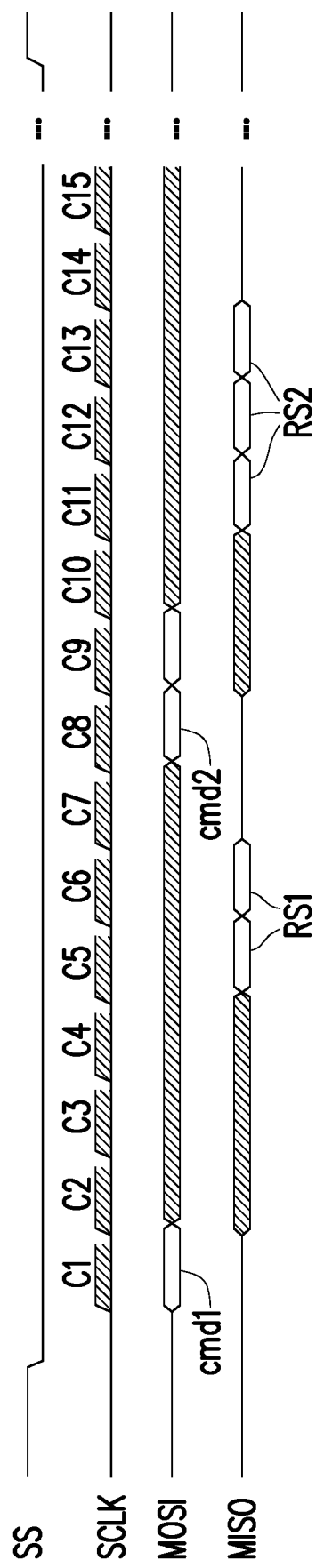
FIG. 2 is a schematic diagram illustrating signal states in a data transmission between a master device and a slave device according to an embodiment of the invention.

FIG. 2 is a schematic diagram illustrating signal states in a data transmission between a master device and a slave device according to an embodiment of the invention.

With reference to FIG. 2, in this exemplary embodiment, it is assumed that the master device 100 intends to conduct the data transmission with the slave device 200. First of all, the master device 100 provides a selection signal through the SS pin to the slave device 200 to select the slave signal 200 for the data transmission. As shown by FIG. 1, the selection signal is, for example, a signal originally at high potential in the SS pin being adjusted to a signal at low potential, which is used to allow the slave device 200 to known that the slave device 200 has been selected by the master device 100.

Further, in this exemplary embodiment, the master device 100 provides a clock signal through the SCLK pin to the slave device 200. In other words, the slave device 200 can execute related operations by directly using the clock signal provided by the master device 100, so as to omit (or reduce) circuits for generating the clock signal in the slave device 200 (e.g., a phase-locked loops (PLL) or an oscillator). It should be noted that, in this embodiment, the master device 100 and the slave device 200 use one byte as a basic unit in a data transmission, and each clock cycle in the clock signal only transmits one bit. In the embodiment of FIG. 2, the master device 100 provides the clock signal through the SCLK pin to the slave device 200, and the clock signal may include clock cycle sets C1 to C15 and more clock cycle sets. In particular, each clock cycle set includes eight clock cycles. In other words, one clock cycle set may be used to transmit data of one byte.

It should be noted that, a first in first out (FIFO) register is used as a temporary storage area for the data transmission in general digital circuits. However, in this embodiment, the master device 100 and the slave device 200 spend at least 8 clock cycles per communication. Since no more than one piece of data is accessed during this time period, the slave device 200 does not need to temporarily store too much data. In other words, when receiving data of one byte (herein, referred to as first byte data), since the data of the next byte (herein, referred to as second byte data) is not being transmitted to the slave device 200 yet, the space temporarily storing the second byte data may be saved. Also, after the first byte data is completely transmitted and taken out form the FIFO register, the second byte data is then received and the FIFO register is used to temporarily store the second byte data. With the aforementioned characteristics, a depth (i.e., capacity) of the FIFO register can be saved.

In this exemplary embodiment, the master device 100 can give (or provide) a command cmd1 (a.k.a. a first command) through the MOSI pin to the slave device 200 during the time of the clock cycle set C1. Afterwards, the slave device 200 executes an operation of the command cmd1 (a.k.a. a first operation) according to the command cmd1 and the clock cycle sets C2 to C4 in the clock signal. In this exemplary embodiment, the first operation is to, for example, read corresponding data according to the command cmd1 and provide the read data through the MISO pin to the master device 100 by the slave device 200. However, it should be noted that, the invention is not intended to limit the content of the first operation.

When the first operation is completed, the slave device 200 generates a response signal RS1 according to the clock cycle sets C5 and C6 in the clock signal provided by the master device 100 to notify the master device 100 an execution result of the first operation corresponding to the command cmd1. For example, in the response signal RS1, a signal provided in the clock cycle set C5 is an acknowledge (ack) signal, and a signal provided in the clock cycle set C6 is a signal used to notify the master device 100 the command cmd1 is executed successfully or executed unsuccessfully.

Afterwards, the master device 100 can, for example, sense the response signal RS1 during the time of the clock cycle set C7 and gives another command cmd2 during the time of the clock cycle set C8.

For example, the master device 100 can give (provide) the command cmd2 through the MOSI pin to the slave device 200 during the time of the clock cycle sets C8 and C9. Afterwards, the slave device 200 executes an operation of the command cmd2 according to the command cmd2 and the clock cycle sets C9 to C10 in the clock signal. However, it should be noted that, the invention is not intended to limit the operation of the command cmd2.

When the operation of the command cmd2 is completed, the slave device 200 generates a response signal RS1 according to the clock cycle sets C11 to C13 in the clock signal provided by the master device 100 to notify the master device 100 an execution result of the operation corresponding to the command cmd2.

It should be noted that, in this exemplary embodiment, for different commands, the master device 100 and the slave device 200 can define a quantity of a clock cycle that each one of the commands needs to spend. More specifically, with the command cmd1 as an example, as shown by FIG. 2, the master device 100 and the slave device 200 will pre-define a quantity of the clock cycle (a.k.a. a first clock cycle) required when the master device 100 provides the command cmd1 to the slave device 200 (e.g., 8 clock cycles (i.e., 1 clock cycle set)), a quantity of the clock cycle (a.k.a. a second clock cycle) required when the slave device 200 executes the first operation corresponding to the command cmd1 (e.g., 24 clock cycles (i.e., 3 clock cycle sets)), a quantity of the clock cycle (a.k.a. a third clock cycle) required when the slave device 200 generates the response signal RS1 (e.g., 16 clock cycles (i.e., 2 clock cycle sets)) and a quantity of the clock cycle to be spent as required by the master device 100 after receiving the response signal RS1.

With the command cmd2 taken as another example, as shown by FIG. 2, the master device 100 and the slave device 200 will pre-define a quantity of the clock cycle required when the master device 100 provides the command cmd2 to the slave device 200 (e.g., 16 clock cycles (i.e., 2 clock cycle sets)), a quantity of the clock cycle required when the slave device 200 executes the operation corresponding to the command cmd2 (e.g., 16 clock cycles (i.e., 2 clock cycle sets)), a quantity of the clock cycle required when the slave device 200 generates the response signal RS2 (i.e., 24 clock cycles (3 clock cycle sets)) and a quantity of the clock cycle to be spent as required by the master device 100 after receiving the response signal RS2.

In particular, by defining the quantity of the clock cycle to be spent as required by each command, the master device 100 can be informed of just how many clock cycles need to be included in the clock signal for the slave device 200. Since the slave device 200 can execute the corresponding operation by directly using the clock signal transmitted from the master device 100, the slave device 200 can omit (or reduce) circuits for generating the clock signal.

Figure 3:
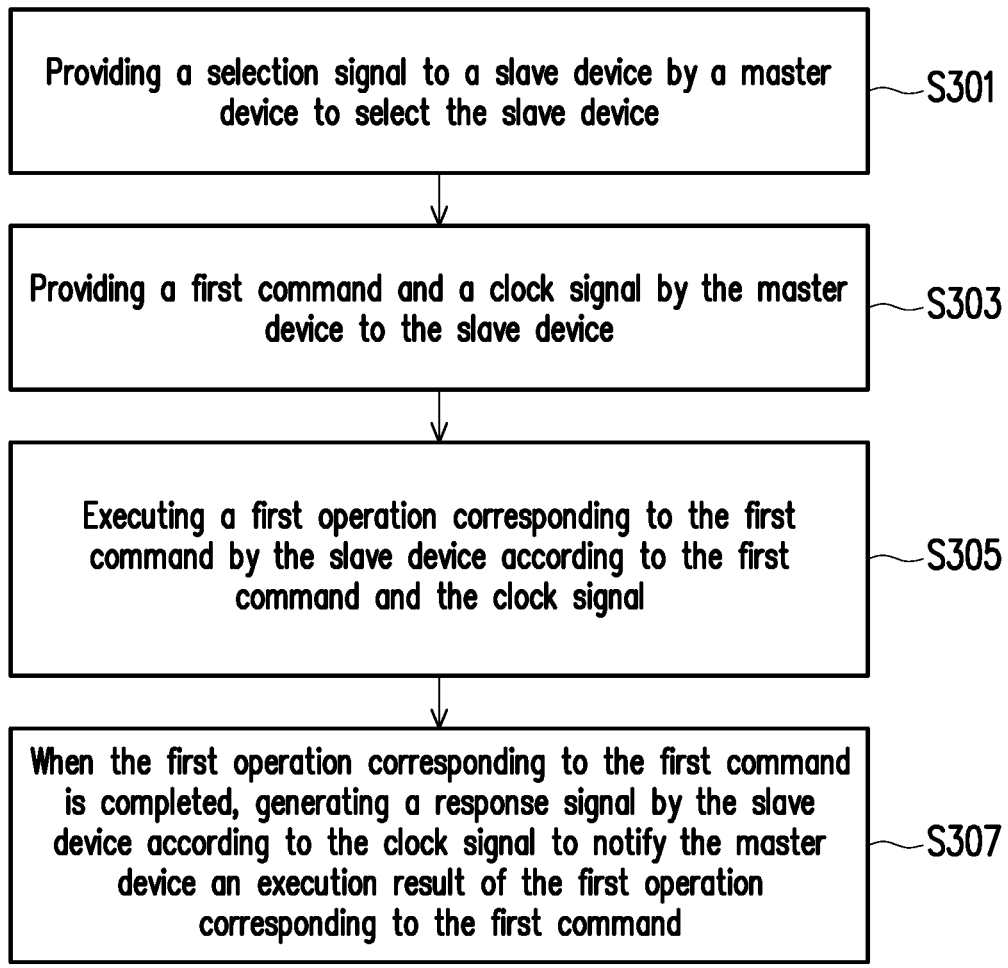
FIG. 3 is a flowchart illustrating a command execution method according to an embodiment of the invention.

FIG. 3 is a flowchart illustrating a command execution method according to an embodiment of the invention.

With reference to FIG. 3, in step S301, the master device 100 provides a selection signal to the slave device 200 to select the slave device 200. In step S303, the master device 100 provides a first command and a clock signal to the slave device 200. In step S305, the slave device 200 executes a first operation corresponding to the first command according to the first command and the clock signal. When the first operation corresponding to the first command is completed, in step S307, the slave device 200 generates a response signal according to the clock signal to notify the master device 100 an execution result of the first operation corresponding to the first command.

Based on the above, the master-slave system and the command execution method in the first embodiment of the invention can allow the slave device to execute the corresponding operation directly according to the clock signal transmitted from the master device, so as to omit (or reduce) circuits for generating the clock signal in the slave device.

Second Embodiment

With respect to data transmission commands (including accesses to a memory or a resistor), according to different traditional command types, the master device will first transmit different operation codes (OP codes) for communication. For example, a single-shot-mode transmission and a burst-mode data transmission will be represented by different OP codes.

However, in the second embodiment of the invention, the same operation code (OP code) used in the single-shot-mode transmission may be also be used when multiple data for continuous address are to be transmitted using the burst-mode data transmission between the master device 100 and the slave device 200. Accordingly, since the same operation code may be used to support the single-shot-mode data transmission and the burst-mode data transmission, definition for the OP codes may be simplified and the number of states in a finite state-machine may be reduced.

Figure 4A:
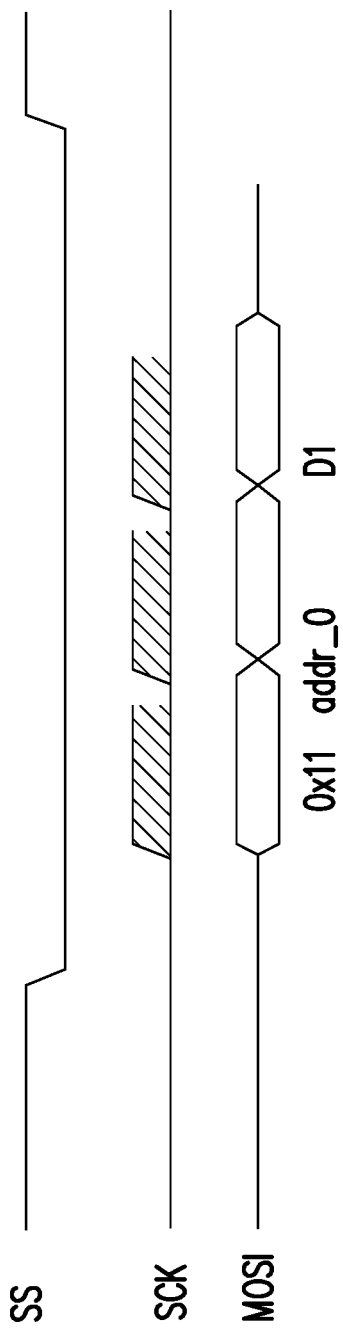
FIG. 4A to FIG. 4C are schematic diagrams illustrating data writing according to an embodiment of the invention.
Figure 4B:
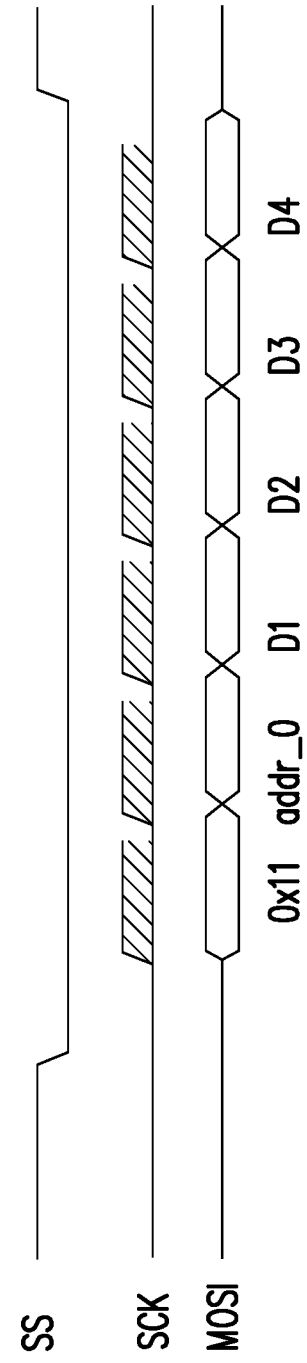
Figure 4C:
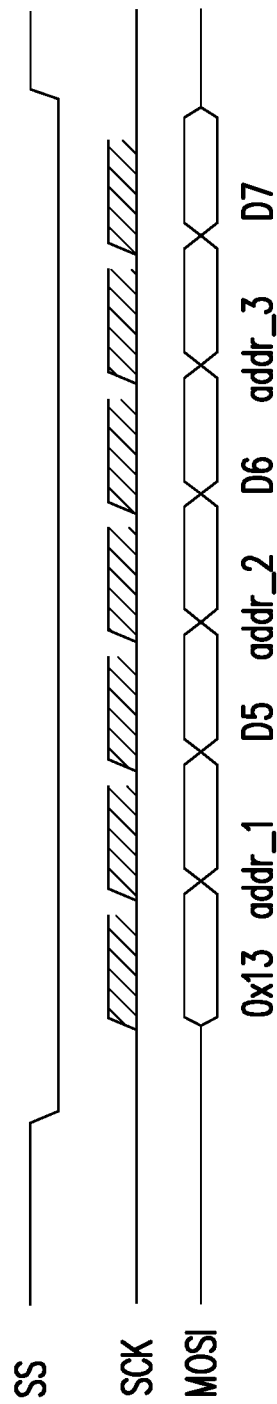

In detail, FIG. 4A to FIG. 4C are schematic diagrams illustrating data writing according to an embodiment of the invention. With reference to FIG. 4A, in this embodiment, it is assumed that the master device 100 intends to conduct a data transmission with the slave device 200. First of all, the master device 100 provides a selection signal through the SS pin to the slave device 200 to select the slave signal 200 for the data transmission. As shown by FIG. 4A, the selection signal is, for example, a signal originally at high potential in the SS pin being adjusted to a signal at low potential, which is used to allow the slave device 200 to known that the slave device 200 has been selected by the master device 100.

Further, in this exemplary embodiment, the master device 100 provides a clock signal through the SCLK pin to the slave device 200. It should be noted that, as similar to the first embodiment, in this embodiment, the master device 100 and the slave device 200 use one byte as a basic unit in a data transmission, and each clock cycle in the clock signal only transmits one bit. In the embodiments of FIG. 4A to FIG. 4C, the master device 100 provides a clock signal through the SLCK pin to the slave device 200, and the clock signal may include a plurality of clock signal sets. In particular, each clock cycle set includes eight clock cycles. In other words, one clock cycle set may be used to transmit data of one byte.

In addition, the master device 100 also provides an operation code (e.g., 0x11) (a.k.a. a first operation code), an address addr_0 (a.k.a. a first address) and a clock signal through the MOSI pin to the slave device 200. The slave device 200 executes a writing operation (a.k.a. a first writing operation) to write data D1 (a.k.a. first data) provided by the master device 100 into the address addr_0 of the slave device 200 according to the first operation code, the address addr_0 and the clock signal provided by the master device 100.

In particular, after the slave device 200 finishes writing the data D1 into the address addr_0, when the slave device 200 does not receive the selection signal again before the master device 100 finishes operations corresponding to the first operation code (i.e., 0x11) and the selection signal ends (i.e., the selection signal is adjusted from low potential back to high potential), as shown by FIG. 4A, the slave device 200 finishes executing the first writing operation. In other words, in the embodiment of FIG. 4A, the master device 100 is used to write one piece of data into one address of the slave device 200.

However, when the slave device 200 finishes writing the data D1 into the address addr_0 and the slave device 200 continuously receives the selection signal before the selection signal ends (i.e., the selection signal is adjusted from low potential back to high potential), as shown by FIG. 4B, the slave device 200 can obtain more data (e.g., data D2 to D4, a.k.a. second data) again from the master device 100 according to the clock signal and sequentially write the obtained second data into addresses adjacent to the address addr_0. For example, the slave device 200 writes the data D2 into the next address of the address addr_0, writes the data D3 into the second address subsequent to the address addr_0, and write the data D4 into the third address subsequent to the address addr_0.

In other words, the embodiment of FIG. 4B is for writing the multiple data to be stored to the continuous addresses, and the operation code used in FIG. 4B may be identical to the operation code used for writing the single data in the embodiment of FIG. 4A. The slave device 200 can determine whether to execute writing the continuous addresses according to whether the clock signal is continuously received within a valid duration of the selection signal (i.e., during which the selection signal is at low potential).

In addition, in another embodiment, as shown by FIG. 4C, when the master device 100 intends to write a plurality of data (a.k.a. third data) into a plurality of discontinuous addresses (a.k.a. a plurality of third addresses) in the slave device 200, the master device 100 can, for example, provide another operation code (e.g., 0x13) (a.k.a. a second operation code), the plurality of third addresses (i.e., an address addr_1, an address addr_2 and an address addr_3) and the clock signal through the MOSI pin to the slave device 200. The slave device 200 executes a second writing operation according to the second operation code to respectively write the plurality of third data (i.e., the data D5 to D7) into the third addresses designated by the master device 100 (i.e., the address addr_1, the address addr_2 and the address addr_3) according to the second operation code, the plurality of third addresses and the clock signal. As shown by FIG. 4C, the slave device 200 writes the data D5 into the address addr_1, writes the data D6 into the address addr_2 and writes the data D7 into the address addr_3.

Figure 5A:
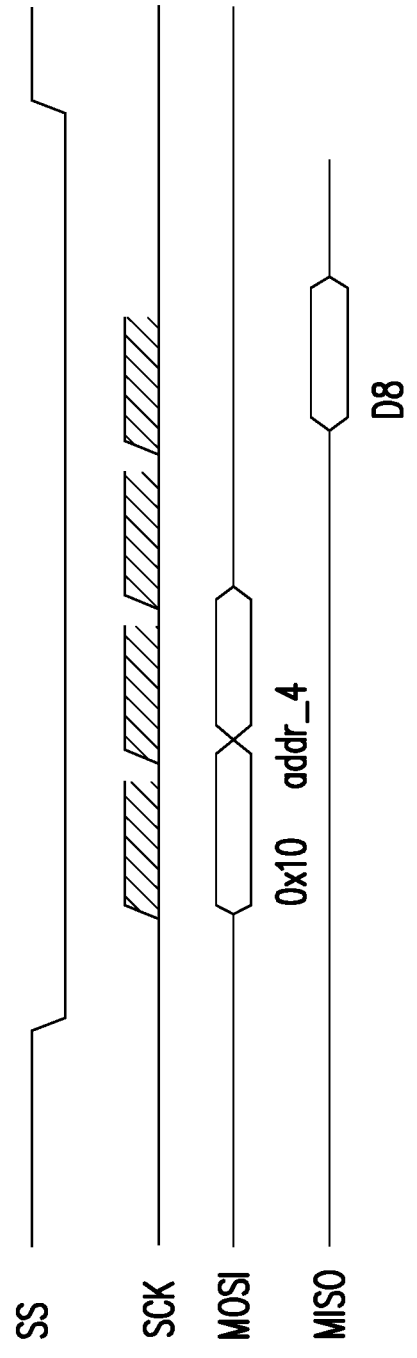

In addition, FIG. 5A to FIG. 5C are schematic diagrams illustrating data reading according to an embodiment of the invention. With reference to FIG. 5A, in this embodiment, it is assumed that the master device 100 intends to conduct a data transmission with the slave device 200. First of all, the master device 100 provides a selection signal through the SS pin to the slave device 200 to select the slave signal 200 for the data transmission. As shown by FIG. 5A, the selection signal is, for example, a signal originally at high potential in the SS pin being adjusted to a signal at low potential, which is used to allow the slave device 200 to known that the slave device 200 has been selected by the master device 100.

Further, in this exemplary embodiment, the master device 100 provides a clock signal through the SCLK pin to the slave device 200. It should be noted that, as similar to the first embodiment, in this embodiment, the master device 100 and the slave device 200 use one byte as a basic unit in a data transmission, and each clock cycle in the clock signal only transmits one bit. In the embodiments of FIG. 5A to FIG. 5C, the master device 100 provides a clock signal through the SLCK pin to the slave device 200, and the clock signal may include a plurality of clock signal sets. In particular, each clock cycle set includes eight clock cycles. In other words, one clock cycle set may be used to transmit data of one byte.

In addition, the master device 100 also provides an operation code (e.g., 0x10) (a.k.a. a first operation code), an address addr_4 (a.k.a. a first address) and a clock signal through the MOSI pin to the slave device 200. The slave device 200 executes a reading operation (a.k.a. a first reading operation) according to the first operation code to read data D8 (a.k.a. first data) from the address addr_4 of the slave device 200 according to the first operation code and the address addr_4, and transmits the data D8 through the MISO pin to the master device 100.

In particular, after the slave device 200 finishes reading the data D8 from the address addr_4, when the slave device 200 does not read the selection signal again before the master device 100 finishes operations corresponding to the first operation code (i.e., 0x10) and the selection signal ends (i.e., the selection signal is adjusted from low potential back to high potential), as shown by FIG. 5A, the slave device 200 finishes the first reading operation. In other word, in the embodiment of FIG. 5A, the master device 100 is used to read one piece of data from one address of the slave device 200.

However, when the slave device 200 finishes reading the data D8 from the address addr_4 and the slave device 200 continuously receives the selection signal before the selection signal ends (i.e., the selection signal is adjusted from low potential back to high potential), as shown by FIG. 5B, the slave device 200 can read more data (e.g., data D9 to D11, a.k.a. second data) again from the slave device 200 according to the clock signal, and transmit the read second data to the master device 100.

In other words, the embodiment of FIG. 5B is for reading the multiple data stored in the continuous addresses, and the operation code used in FIG. 5B may be identical to the operation code used for reading the single data in the embodiment of FIG. 5A. The slave device 200 can determine whether to execute reading the continuous addresses according to whether the clock signal is continuously received within a valid duration of the selection signal (i.e., during which the selection signal is at low potential).

Further, in another embodiment, as shown by FIG. 5C, when the master device 100 intends to read a plurality of data (a.k.a. third data) from a plurality of discontinuous addresses (a.k.a. a plurality of third addresses) in the slave device 200, the master device 100 can, for example, provide another operation code (e.g., 0x12) (a.k.a. a second operation code), the plurality of third addresses (i.e., an address addr_5 to an address addr_10) and the clock signal through the MOSI pin to the slave device 200. The slave device 200 executes a second reading operation according to the second operation code to read the plurality of third data (i.e., the data D12 to D15) from the plurality of third addresses (i.e., the address addr_5 to the address addr_10) of the slave device 200 according to the second operation code, the plurality of third addresses and the clock signal, and transmits the read third data through the MISO pin to the master device 100. As shown by FIG. 5C, the slave device 200 reads the data D12 from the address addr_5 and transmits the data D12 to the master device 100, reads the data D13 from the address addr_6 and transmits the data D13 to the master device 100, reads the data D14 from the address addr_7 and the data D14 transmits to the master device 100, reads the data D15 from the address addr_8 and transmits the data D15 to the master device 100, and the rest may be deduced by analogy.

With the above method, the same operation code (OP code) used in the single-shot-mode transmission may be also be used when multiple data for continuous address are to be read or written using the burst-mode data transmission between the master device 100 and the slave device 200. Accordingly, since the same operation code may be used to support the single-shot-mode data transmission and the burst-mode data transmission, definition for the OP codes may be simplified and the number of states in a finite state-machine may be reduced.

Figure 6:
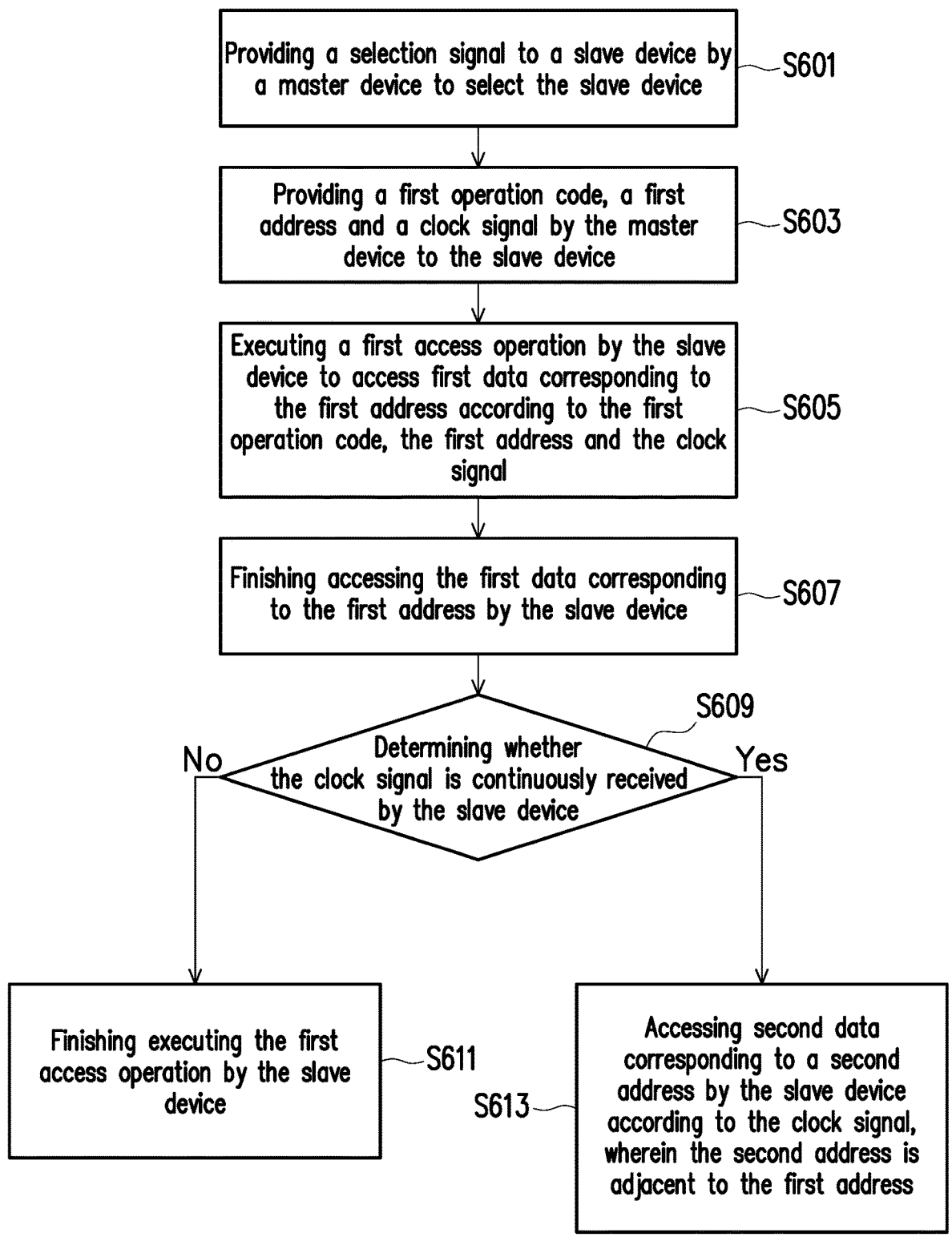
FIG. 6 is a flowchart illustrating a data access method according an embodiment of the invention.

FIG. 6 is a flowchart illustrating a data access method according to an embodiment of the invention.

With reference to FIG. 6, in step S601, the master device 100 provides a selection signal to the slave device 200 to select the slave device 200. In step S603, the master device 100 provides a first operation code, a first address and a clock signal to the slave device 200. In step S605, the slave device 200 executes a first access operation to access first data corresponding to the first address according to the first operation code, the first address and the clock signal. In step S607, the slave device 200 finishes accessing the first data corresponding to the first address. In step S609, the slave device 200 determines whether the clock signal is continuously received. When the slave device 200 does not receive the clock signal again before the master device 100 finishes operations corresponding to the first operation code, in step S611, the slave device 200 finishes executing the first access operation. When the slave device 200 continuously receives the clock signal, in step S613, the slave device 200 accesses second data corresponding to a second address according to the clock signal, wherein the second address is adjacent to the first address.

In summary, the master-slave system, the command execution method and the data access method of the invention can allow the slave device to execute the corresponding operation directly according to the clock signal transmitted from the master device, so as to omit (or reduce) circuits for generating the clock signal in the slave device. Moreover, in the master-slave system, the command execution method and the data access method of the invention, the same operation code (OP code) used in the single-shot-mode transmission may also be used when multiple data for continuous address are to be transmitted using the burst-mode data transmission between the master device and the slave device. Accordingly, since the same operation code may be used to support the single-shot-mode data transmission and the burst-mode data transmission, definition for the OP codes may be simplified and the number of states in a finite state-machine may be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A master-slave system, comprising:
a master device, having a first interface; and
a slave device, having a second interface, the second interface being electrically connected to the first interface, wherein
the master device provides a first command and a clock signal to the slave device,
the slave device executes a first operation corresponding to the first command according to the first command and the clock signal, and
when the first operation corresponding to the first command is completed, the slave device generates a response signal according to the clock signal to notify the master device an execution result of the first operation corresponding to the first command,
wherein before the operation where the master device provides the first command and the clock signal to the slave device,
the master device and the slave device pre-define a quantity of a first clock cycle in the clock signal required when the master device provides the first command to the slave device, a quantity of a second clock cycle in the clock signal required when the slave device executes the first operation corresponding to the first command and a quantity of a third clock cycle in the clock signal required when the slave device generates the response signal.

2. The master-slave system according to claim 1, wherein before the operation where the master device provides the first command and the clock signal to the slave device, the master device provides a selection signal to the slave device to select the slave device to execute the first operation corresponding to the first command.

3. The master-slave system according to claim 1, wherein the master device and the slave device use one byte as a basic unit in a data transmission, and each clock cycle in the clock signal only transmits one bit.

4. The master-slave system according to claim 2, wherein the first interface and the second interface are serial peripheral Interfaces (SPI).

5. The master-slave system according to claim 4, wherein the selection signal is provided to the slave device by a select slave (SS) pin in the serial peripheral interface, the clock signal is provided to the slave device through a serial clock (SCLK) pin in the serial peripheral interface, the first command is provided to the slave device through a master output slave input (MOSI) pin in the serial peripheral interface, and the response signal is provided to the slave device through a master input slave output (MISO) pin in the serial peripheral interface.

6. A command execution method for a master-slave system, the master-slave system comprising a master device having a first interface and a slave device having a second interface, the second interface being electrically connected to the first interface; the method comprising:
providing a first command and a clock signal to the slave device by the master device;
executing a first operation corresponding to the first command by the slave device according to the first command and the clock signal; and
when the first operation corresponding to the first command is completed, generating a response signal by the slave device according to the clock signal to notify the master device an execution result of the first operation corresponding to the first command,
wherein before the step of providing the first command and the clock signal to the slave device, the method further comprises:
pre-defining, by the master device and the slave device, a quantity of a first clock cycle in the clock signal required when the master device provides the first command to the slave device, a quantity of a second clock cycle in the clock signal required when the slave device executes the first operation corresponding to the first command and a quantity of a third clock cycle in the clock signal required when the slave device generates the response signal.

7. The command execution method according to claim 6, wherein before the step of providing the first command and the clock signal to the slave device, the method further comprises:
providing a selection signal to the slave device by the master device to select the slave device to execute the first operation corresponding to the first command.

8. The command execution method according to claim 6, wherein the master device and the slave device use one byte as a basic unit in a data transmission, and each clock cycle in the clock signal only transmits one bit.

9. The command execution method according to claim 7, wherein the first interface and the second interface are serial peripheral Interfaces (SPI).

10. The command execution method according to claim 9, wherein the selection signal is provided to the slave device by a select slave (SS) pin in the serial peripheral interface, the clock signal is provided to the slave device through a serial clock (SCLK) pin in the serial peripheral interface, the first command is provided to the slave device through a master output slave input (MOSI) pin in the serial peripheral interface, and the response signal is provided to the slave device through a master input slave output (MISO) pin in the serial peripheral interface.

11. A master-slave system, comprising:
a master device, having a first interface; and
a slave device, having a second interface, the second interface being electrically connected to the first interface, wherein
the master device provides a first operation code (OP code), a first address and a clock signal to the slave device,
the slave device executes a first access operation to access first data corresponding to the first address according to the first operation code, the first address and the clock signal,
when the slave device finishes accessing the first data corresponding to the first address and the slave device does not receive the clock signal again before the master device finishes operations corresponding to the first operation code, the slave device finishes executing the first access operation, and
when the slave device finishes accessing the first data corresponding to the first address and the slave device continuously receives the clock signal, the slave device accesses second data corresponding to a second address according to the clock signal, wherein the second address is adjacent to the first address.

12. The master-slave system according to claim 11, wherein
the master device provides a second operation code, a plurality of third addresses and the clock signal to the slave device,
the slave device executes a second access operation to access a plurality of third data corresponding to the plurality of third addresses according to the second operation code, the plurality of third addresses and the clock signal.

13. The master-slave system according to claim 11, wherein the first access operation is a first writing operation, wherein in the operation of executing the first access operation to access the first data corresponding to the first address according to the first operation code, the first address and the clock signal,
the slave device executes the first writing operation to write the first data into the first address of the slave device according to the first operation code, the first address and the clock signal,
wherein in the operation of accessing the second data corresponding to the second address according to the clock signal, the slave device writes the second data into the second address of the slave device.

14. The master-slave system according to claim 11, wherein the first access operation s a first reading operation, wherein in the operation of executing the first access operation to access the first data corresponding to the first address according to the first operation code, the first address and the clock signal,
the slave device executes the first reading operation to read the first data from the first address of the slave device according to the first operation code, the first address and the clock signal,
wherein in the operation of accessing the second data corresponding to the second address according to the clock signal, the slave device reads the second data from the second address of the slave device.

15. The master-slave system according to claim 11, wherein before the operation of providing the first operation code, the first address and the clock signal to the slave device,
the master device provides a selection signal to the slave device to select the slave device to execute the first access operation.

16. The master-slave system according to claim 12, wherein the second access operation is a second writing operation, wherein in the operation of executing the second access operation to access the plurality of third data corresponding to the plurality of third addresses according to the second operation code, the plurality of third addresses and the clock signal,
the slave device executes the second writing operation to respectively write the plurality of third data into the plurality of third addresses of the slave device according to the second operation code, the plurality of third addresses and the clock signal.

17. The master-slave system according to claim 12, wherein the second access operation is a second reading operation, wherein in the operation of executing the second access operation to access the plurality of third data corresponding to the plurality of third addresses according to the second operation code, the plurality of third addresses and the clock signal,
the slave device executes the second reading operation to respectively read the plurality of third data from the plurality of third addresses of the slave device according to the second operation code, the plurality of third addresses and the clock signal.

18. The master-slave system according to claim 15, wherein the first interface and the second interface are serial peripheral Interfaces (SPI).

19. The master-slave system according to claim 18, wherein the selection signal is provided to the slave device through a select slave (SS) pin in the serial peripheral interface, the clock signal is provided to the slave device through a serial clock (SCLK) pin in the serial peripheral interface, the first operation code and the first address are provided to the slave device through a master output slave input (MOSI) pin in the serial peripheral interface, and the first data and the second data are provided to the slave device through the master output slave input (MOSI) pin in the serial peripheral interface, or provided to the master device through a master input slave output (MISO) pin in the serial peripheral interface.

20. A data access method for a master-slave system, the master-slave system comprising a master device having a first interface and a slave device having a second interface, the second interface being electrically connected to the first interface, the method comprising:
providing a first operation code (OP code), a first address and a clock signal to the slave device by the master device;
executing a first access operation by the slave device to access first data corresponding to the first address according to the first operation code, the first address and the clock signal;
when the slave device finishes accessing the first data corresponding to the first address and the slave device does not receive the clock signal again before the master device finishes operations corresponding to the first operation code, finishing executing the first access operation by the slave device; and
when the slave device finishes accessing the first data corresponding to the first address and the slave device continuously receives the clock signal, accessing second data corresponding to a second address by the slave device according to the clock signal, wherein the second address is adjacent to the first address.

21. The data access method according to claim 20, further comprising:
providing a second operation code, a plurality of third addresses and the clock signal to the slave device by the master device; and
executing a second access operation by the slave device to access a plurality of third data corresponding to the plurality of third addresses according to the second operation code, the plurality of third addresses and the clock signal.

22. The data access method according to claim 20, wherein the first access operation is a first writing operation, wherein the step of executing the first access operation to access the first data corresponding to the first address according to the first operation code, the first address and the clock signal comprises:
executing the first writing operation by the slave device to write the first data into the first address of the slave device according to the first operation code, the first address and the clock signal,
wherein the step of accessing the second data corresponding to the second address according to the clock signal comprises:
writing the second data into the second address of the slave device by the slave device.

23. The data access method according to claim 21, wherein the second access operation is a second writing operation, wherein the step of executing the second access operation to access the plurality of third data corresponding to the plurality of third addresses according to the second operation code, the plurality of third addresses and the clock signal comprises:
executing the second writing operation by the slave device to respectively write the plurality of third data into the plurality of third addresses of the slave device according to the second operation code, the plurality of third addresses and the clock signal.

24. The data access method according to claim 20, wherein before the step of providing the first operation code, the first address and the clock signal to the slave device, the method further comprises:
providing a selection signal to the slave device by the master device to select the slave device to execute the first access operation.

25. The data access method according to claim 20, wherein the first access operation is a first reading operation, wherein the step of executing the first access operation to access the first data corresponding to the first address according to the first operation code, the first address and the clock signal comprises:
executing the first reading operation by the slave device to read the first data from the first address of the slave device according to the first operation code, the first address and the clock signal,
wherein the step of accessing the second data corresponding to the second address according to the clock signal comprises:

reading the second data from the second address of the slave device by the slave device.

26. The data access method according to claim 21, wherein the second access operation is a second reading operation, wherein the step of executing the second access operation to access the plurality of third data corresponding to the plurality of third addresses according to the second operation code, the plurality of third addresses and the clock signal comprises:

executing the second reading operation by the slave device to respectively read the plurality of third data from the plurality of third addresses of the slave device according to the second operation code, the plurality of third addresses and the clock signal.

27. The data access method according to claim 24, wherein the first interface and the second interface are serial peripheral Interfaces (SPI).

28. The data access method according to claim 27, wherein the selection signal is provided to the slave device through a select slave (SS) pin in the serial peripheral interface, the clock signal is provided to the slave device through a serial clock (SCLK) pin in the serial peripheral interface, the first operation code and the first address are provided to the slave device through a master output slave input (MOSI) pin in the serial peripheral interface, and the first data and the second data are provided to the slave device through the master output slave input (MOSI) pin in the serial peripheral interface, or provided to the master device through a master input slave output (MISO) pin in the serial peripheral interface.

* * * * *